(12) United States Patent
del Puerto

(10) Patent No.: US 6,369,874 B1
(45) Date of Patent: Apr. 9, 2002

(54) PHOTORESIST OUTGASSING MITIGATION SYSTEM METHOD AND APPARATUS FOR IN-VACUUM LITHOGRAPHY

(75) Inventor: Santiago E. del Puerto, Milton, NY (US)

(73) Assignee: Silicon Valley Group, Inc., San Jose, CA (US)

( * ) Notice: Subject to any disclaimer, the term of this patent is extended or adjusted under 35 U.S.C. 154(b) by 0 days.

(21) Appl. No.: 09/551,531

(22) Filed: Apr. 18, 2000

(51) Int. Cl.[7] .................. G03B 27/52; G03B 27/54; G03B 27/32; H01L 21/31; A61N 5/00
(52) U.S. Cl. ..................... 355/30; 355/55; 355/67; 355/76; 355/77; 438/773; 438/795; 250/492.2; 250/492.22
(58) Field of Search .................. 355/30, 55, 67, 355/76, 77; 438/773, 795; 250/492.2, 492.22

(56) References Cited

U.S. PATENT DOCUMENTS

| | | | |
|---|---|---|---|
| 4,408,338 A | | 10/1983 | Grobman .................. 378/34 |
| 5,973,764 A | * | 10/1999 | Mc Cullough et al. ........ 355/30 |
| 6,031,598 A | * | 2/2000 | Tichenor et al. ............. 355/67 |

FOREIGN PATENT DOCUMENTS

| | | | |
|---|---|---|---|
| EP | 0 532 968 A1 | 3/1993 | ............. G03F/7/20 |
| EP | 0 957 402 A2 | 11/1999 | ............. G03F/7/20 |

OTHER PUBLICATIONS

Jos. P.H. Benschop et al., *Euclides: European EUV Lithography Milestones*, Solid State Technology, Sep. 1999, pp. 43, 44, 46, 51, and 52.

Roderick R. Kunz et al., *Photo–induced Organic Contamination of Lithographic Optics*, Microlithography World, Winter 2000, pp. 2, 4, 6, and 8.

B.M. Mertens et al., *Mitigation of Surface Contamination from Resist Outgassing in EUV Lithography* (paper presented at Micro and Nano Engineering 99 International Conference (Rome, Sep. 21–23, 1999)), 4 pages.

* cited by examiner

Primary Examiner—Russell Adams
Assistant Examiner—Khaled Brown
(74) Attorney, Agent, or Firm—Sterne, Kessler, Goldstein & Fox PLLC

(57) ABSTRACT

A windowless system and apparatus are provided that prevent outgases from contaminating the projection optics of an in-vacuum lithography system. The outgassing mitigation apparatus comprises a chimney that is substantially closed at one end, a duct fluidly coupled to the chimney, and a baffle disposed within the chimney. The chimney of the outgassing mitigation apparatus is funnel shaped at the end that is substantially closed. This end of the chimney has an opening that permits a beam or bundle of light to pass through the chimney. A rotating barrier, having at least one aperture for the passage of light, can be positioned near the chimney so that the rotating barrier substantially closes an open end of the chimney except when one of the apertures of the rotating barrier is passing by the chimney. This rotating barrier can be chilled by a refrigerator unit, which is radiantly coupled to a portion of the rotating barrier. A motor is used to rotate the barrier. A light source synchronization module is used to trigger a pulsed light source while the apertures of the rotating barrier are aligned with the chimney of the outgassing mitigation apparatus. Moreover, a barrier gas system can be used to inject a barrier gas into the chimney.

25 Claims, 13 Drawing Sheets

PHOTORESIST OUTGASSING MITIGATION SYSTEM METHOD AND APPARATUS FOR IN-VACUUM LITHOGRAPHY

BACKGROUND OF THE INVENTION

1. Field of the Invention

The present invention relates to in-vacuum lithography. More particularly, it relates to photoresist outgassing in an in-vacuum lithography system.

2. Related Art

One of the many processing steps for manufacturing microelectronic circuits on a semiconductor wafer includes coating the wafer with a thin layer of photoresist and exposing the coated wafer to a source of light through a patterned mask. This process is known as lithography. The size of the microelectronic circuit features that can be produced using lithography is inversely related to the wavelength of the light used to expose the coated wafer.

In order to reproduce very fine microelectronic circuit features, a source of extreme ultraviolet (EUV) light, such as a laser-produced plasma (LPP) or synchrotron, must be used. Using EUV light, it is possible to reproduce microelectronic circuit features down to 0.03 micron. Because EUV light is readily absorbed by matter, EUV lithography is carried out in a vacuum.

One means for performing lithography is described in U.S. Pat. No. 4,408,338 to Grobman (hereinafter Grobman). Grobman describes a form of x-ray lithography known as contact or proximity printing. In contact printing, the wafer to be exposed is placed very close to the mask, and there are no reducing optics used between the mask and the wafer. The features of the mask are reproduced on the wafer without reduction. This aspect of contact printing, however, makes the masks used in contact printing systems both difficult to design and expensive to produce. Furthermore, it makes contact printing impractical for many applications such as, for example, application specific integrated circuits and systems on a chip that have very small circuit features.

In order to reduce the difficulty and costs associated with designing and producing masks for use in an EUV lithography system, it is highly desirable to include projection optics in an EUV lithography system between the mask and the wafer to be exposed. Projection optics can be used to reduce the size of the features reproduced on the wafer, and thereby allow masks to be used that have larger patterns.

It is a property of photoresist that it outgases or produces byproducts, especially when it is exposed to high energy light. These outgassed resist products are generally referred to herein as "resist gases," "resist outgases," or "outgases." Among the outgases produced by photoresist are hydrocarbon molecules that can condense on the projection optics of an EUV lithography system. Condensed outgases absorb EUV light and with time significantly reduce the total reflectivity of the projection optics of an EUV lithography system. Mitigating photoresist outgassing therefore is extremely important in an in-vacuum EUV lithography system having projection optics between the mask and the wafer to be exposed. If photoresist outgasing is not controlled or mitigated in such an EUV lithography system, outgases will render the EUV lithography system useless in a very short time (i.e., in about 100 seconds).

In order to preclude photoresist outgased byproducts from condensing on the projection optics of an EUV lithography system, the wafer stage of a EUV lithography system must be housed in a separate chamber from the projection optics.

Theoretically, the wafer stage chamber of an EUV lithography system could be connected to the projection optics chamber by a window, similar to the window of Grobman. A window would allow some light to pass from the projection optics chamber to the wafer stage chamber to expose a coated wafer while preventing photoresist outgases from entering the projection optics chamber and condensing on the projection optics. Using a window, however, would significantly lengthen the minimum time that it takes to reproduce a microelectronic circuit on a semiconductor wafer. This is due to the fact that a window, like condensed outgases, absorbs a significant amount of EUV light, thus lengthening exposure time. Even an extremely thin window would absorb too much light to work with EUV light (i.e., a window, free of outgassing contamination, would absorb more than fifty percent of the incident EUV light). It should be noted here that Grobman is able to use a window only because Grobman uses x-rays, which can penetrate the window without significant losses, to expose the wafer rather than EUV light.

Using a window to prevent outgases from entering the projection optics chamber of an EUV lithography system also has additional drawbacks. For example, outgases would condense and buildup on the window over a short period of time. This buildup of condensed outgases would even further reduce the amount of EUV light that could pass through the window and reach a wafer. Over a short period of time (i.e., less than one hour), the buildup of condensed outgases on the window would reduce the throughput of EUV light to a point where any EUV lithography system (as compared to the x-ray system of Grobman) would be rendered useless.

One windowless means for controlling outgassing in an EUV lithography system is discussed in an article by Jos P. H. Benschop et al., in the September 1999 issue of Solid State Technology, titled "EUCLIDES: European EUV lithography milestones," which is herein incorporated in its entirety by reference. In this article, the authors suggests that by connecting the projection optics chamber and the wafer stage chamber of an EUV lithography system with a tube, and injecting a gas into the connecting tube, a gas flow can be established from the tube into the wafer stage chamber that will apparently preclude photoresist outgases from entering the projection optics chamber. Apparently, this device is based on the idea that outgases will not travel against the gas flow that the authors suggest can be established from the connecting tube into the wafer stage chamber.

While the photoresist outgassing control means suggested by Jos P. H. Benschop et al might work in some system, it will not work in EUV lithography systems that use positional monitoring devices to keep a wafer in focus during exposure. Positional monitoring devices of the type known to those skilled in the relevant art, for example, very accurate capacitance focusing devices or gages that use changes in the capacitance of a device to detect small changes in the position of a surface near the device, must be mounted on a stable surface that is in close proximity to the wafer (i.e., these devices must be mounted on a stable surface close to the wafer so that the end of the device is firmly held within about one millimeter of the wafer). The most stable surface available for mounting positional monitoring devices is the partition located between the projection optics chamber and the wafer stage chamber, and thus the partition is the best place for mounting the positional monitoring devices. As a result, the wafer must be positioned in close proximity to the partition, and the wafer blocks the flow of gas into the wafer stage chamber from the connecting tube discussed by Benschop et al. Most if not all of the gas injected into the connecting tube discussed by Benschop et al. flows into the projection optics chamber rather than the wafer stage chamber because this flow path is the flow path of least resistance.

Therefore, a need exists for a photoresist outgassing mitigation device without a window that will work with any EUV lithography system, including one that uses positional monitoring devices to keep a wafer in focus during its exposure.

SUMMARY OF THE INVENTION

The present invention is directed to a photoresist outgassing mitigation system, method, and apparatus. The outgassing mitigation system and apparatus comprise a chimney that is substantially closed at one end, a duct fluidly coupled to the chimney, and a baffle disposed within the chimney. The chimney of the outgassing mitigation apparatus is funnel shaped at the end that is substantially closed. This end of the chimney has an opening that permits a beam or bundle of light to pass through the chimney.

In an embodiment of the present invention, a rotating mechanical barrier, having at least one aperture for the passage of light, is positioned near the chimney so that the rotating barrier substantially closes an open end of the chimney except when one of the apertures of the rotating barrier is passing by the chimney. This rotating barrier is chilled by a refrigerator unit, which is radiantly coupled to a portion of the rotating barrier. A motor having magnetic bearings is used to rotate the barrier. The magnetic bearings thermally isolate the disk from the motor.

In an embodiment of the present invention, a light source synchronisation module is used to trigger a pulsed light source while the apertures of the rotating barrier are aligned with the chimney of the outgassing mitigation apparatus.

In another embodiment of the present invention, the baffle disposed within the chimney is chilled by a cooling unit.

In still another embodiment of the present invention, a barrier gas system is used to inject a barrier gas into the chimney.

BRIEF DESCRIPTION OF THE FIGURES

The accompanying drawings, which are incorporated in and form a part of this specification, illustrate embodiments of the present invention and, together with the description, serve to explain the principles of the invention.

DETAILED DESCRIPTION OF THE PREFERRED EMBODIMENTS

Figure 1:
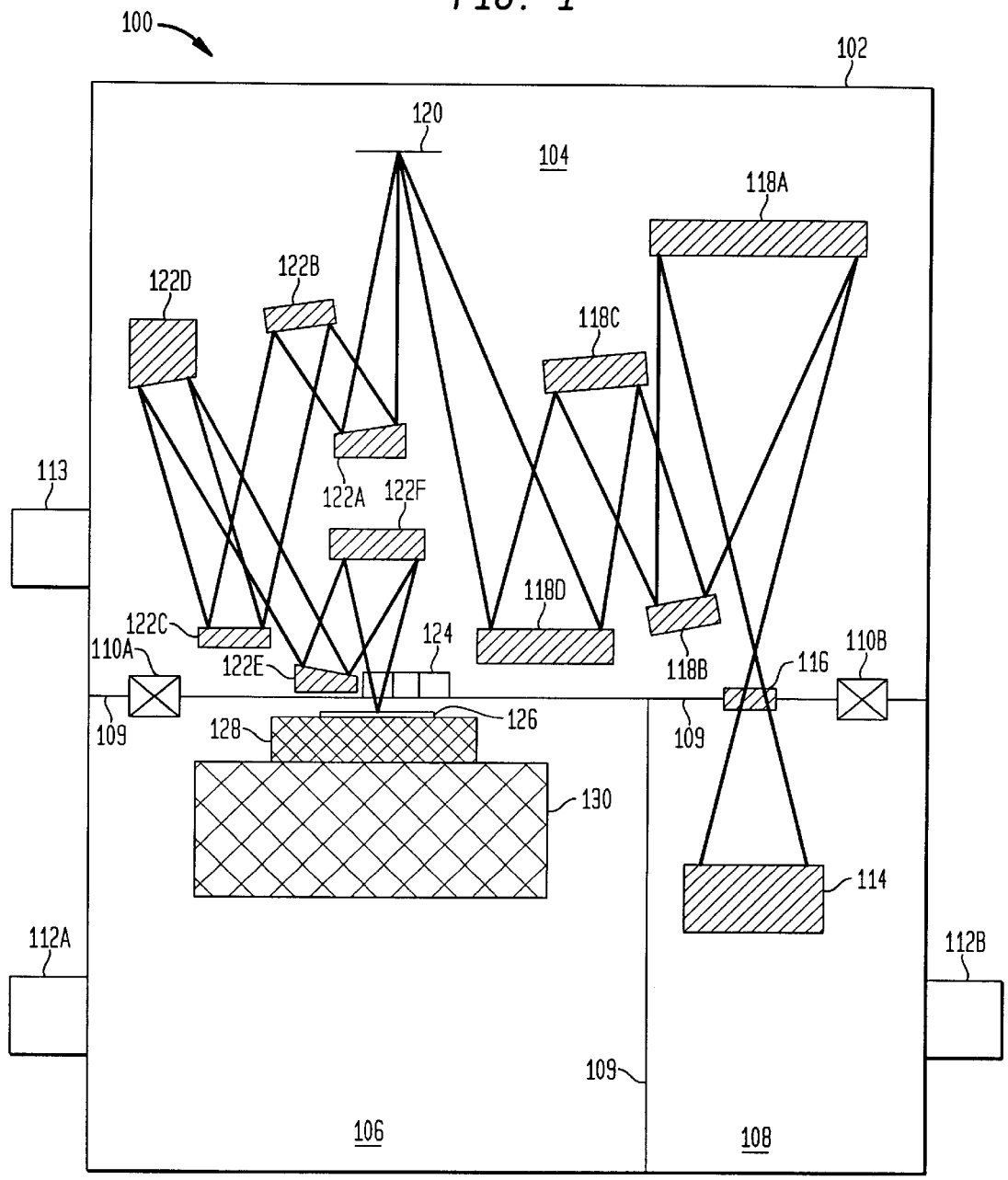
FIG. 1 is a diagram of an extreme ultra violet lithography system in which the present invention can be used.

The system, method, and apparatus of the present invention are described with reference to the accompanying drawings, which are not drawn to scale. In the drawings, like reference numbers indicate identical or functionally similar elements. Additionally, the left-most digit of a reference number identifies the drawing in which the reference number first appears.

Reference will be made in detail to present embodiments of the invention, examples of which are illustrated in the accompanying drawings. While the invention will be described in conjunction with the present embodiments, it will be understood that they are not intended to limit the invention to just these embodiments. On the contrary, the invention is intended to cover alternatives, modifications and equivalents, which can be included within the spirit and scope of the invention as defined by the appended claims. Furthermore, in the following description, for purposes of explanation, numerous specific details are set forth in order to provide a thorough understanding of the present invention. It will be obvious, however, to one skilled in the art, upon reading this disclosure, that the present invention can be practiced without these specific details. In other instances, well-known structures and devices are not described in detail in order to avoid obscuring aspects of the present invention.

Environment of the Invention

FIG. 1 is a diagrammatic representation of an extreme ultra violet (EUV) lithography system 100, in which the present invention can be used. Lithography system 100 comprises a vacuum chamber 102 having pressure zones 104, 106, and 108, separated by partitions 109. Pressure zone 104 houses the optics of lithography system 100. Pressure zone 106 houses the wafer stage of lithography system 100. Pressure zone 108 houses the light source of lithography system 100. Pressure zones 104 and 106 are connected by a pump-down bypass valve 110A, and pressure zones 104 and 108 are connected by a pump-down bypass valve 110B. Turbo-pumps 112A and 112B are used to evacuate pressure chamber 102 and maintain pressure zones 106 and 108 at a lower pressure than pressure zone 104.

Pressure zone 108 houses an EUV light source 114. EUV light means extreme ultraviolet radiation. In one embodiment, a wavelength in the range of 10 to 14 nanometers (nm) is used. Because EUV light is readily absorbed by matter, pressure zones 104, 106, and 108 are evacuated before and/or during operation of the tool. Pressure zone 108 is maintained at about 1 mTorr, as would be apparent to a person skilled in the lithography art. The atmosphere of pressure zone 108 comprises about seventy percent helium and about thirty percent xenon.

EUV light source 114 is preferably a pulsed actinic light source. Other sources of EUV light can be used, however. The pulsed actinic light exits pressure zone 108 through a spectral filter 116. The purpose of spectral filter 116 is to limit the bandwidth of the light entering pressure zone 104, as would be apparent to a person skilled in the lithography art. About fifty percent of the incident EUV light is absorbed by spectral filter 116, as well as virtually all other light.

Upon entering pressure zone 104, the actinic light is focused onto a reticle 120 by mirrors 118A–118D. Mirrors, rather than lenses, are used to focus the actinic light to prevent absorption of the actinic light. The actinic light leaving reticle 120 is focused by mirrors 122A–122F onto a wafer 126 in pressure zone 106. The actinic light exits pressure zone 104 through outgassing mitigation device 124, according to the present invention. The structure of outgassing mitigation device 124 is further described below with regard to FIGS. 2–8.

Pressure zone 104 is maintained at a pressure sufficient to maintain viscous flow of the gases in pressure zone 104 between mirror 122F and wafer 126. This condition is met when the mean free path of the gases in pressure zone 104 is at most about one-one hundredth of the distance between mirror 122F and wafer 126. When this condition is satisfied, the gas molecules behave as a fluid (i.e., a continuum, wherein the gas molecules tend to push each other around and wherein collisions between the gas molecules dominate the behavior of the gases). In the preferred embodiment of lithography system 100, a pressure of about 24 mTorr is maintained in pressure zone 104 to ensure viscous flow of the gases. If a higher pressure is maintained in pressure zone 104, the mean free path of the gases in pressure zone 104 becomes smaller and viscosity increases, but more light is absorbed (scattered) in pressure zone 104.

The atmosphere of pressure zone 104 comprises hydrogen gas supplied by photoresist outgassing. Cryopump 113 is used for selectively condensing gases in pressure zone 104 that are heaver than hydrogen gas. Makeup gas that is needed to maintain a pressure differential between pressure zones 104 and 106 is introduced into pressure zone 104 through a gas port (not shown). The flow of gases from pressure zone 104 into pressure zone 106 is further discussed below with respect to FIG. 2.

Pressure zone 106 houses the wafer stage of lithography system 100. Wafer 126 is held on a rigid wafer plate or chuck 128 that is connected to a step and scan device 130. Wafer 126 is kept in the focal plane of lithography system 100 during scanning using positional monitoring devices (not shown), for example, capacitance focusing devices of the type known to those skilled in the relevant art.

In the preferred embodiment of lithography system 100, a pressure of about 10 mTorr is maintained in pressure zone 106. The atmosphere of pressure zone 106 comprises hydrogen gas, carbon dioxide, and other hydrocarbon molecules, which are supplied by photoresist outgassing.

Preferred Embodiment of a Photoresist Outgassing Mitigation Apparatus

Figure 2:
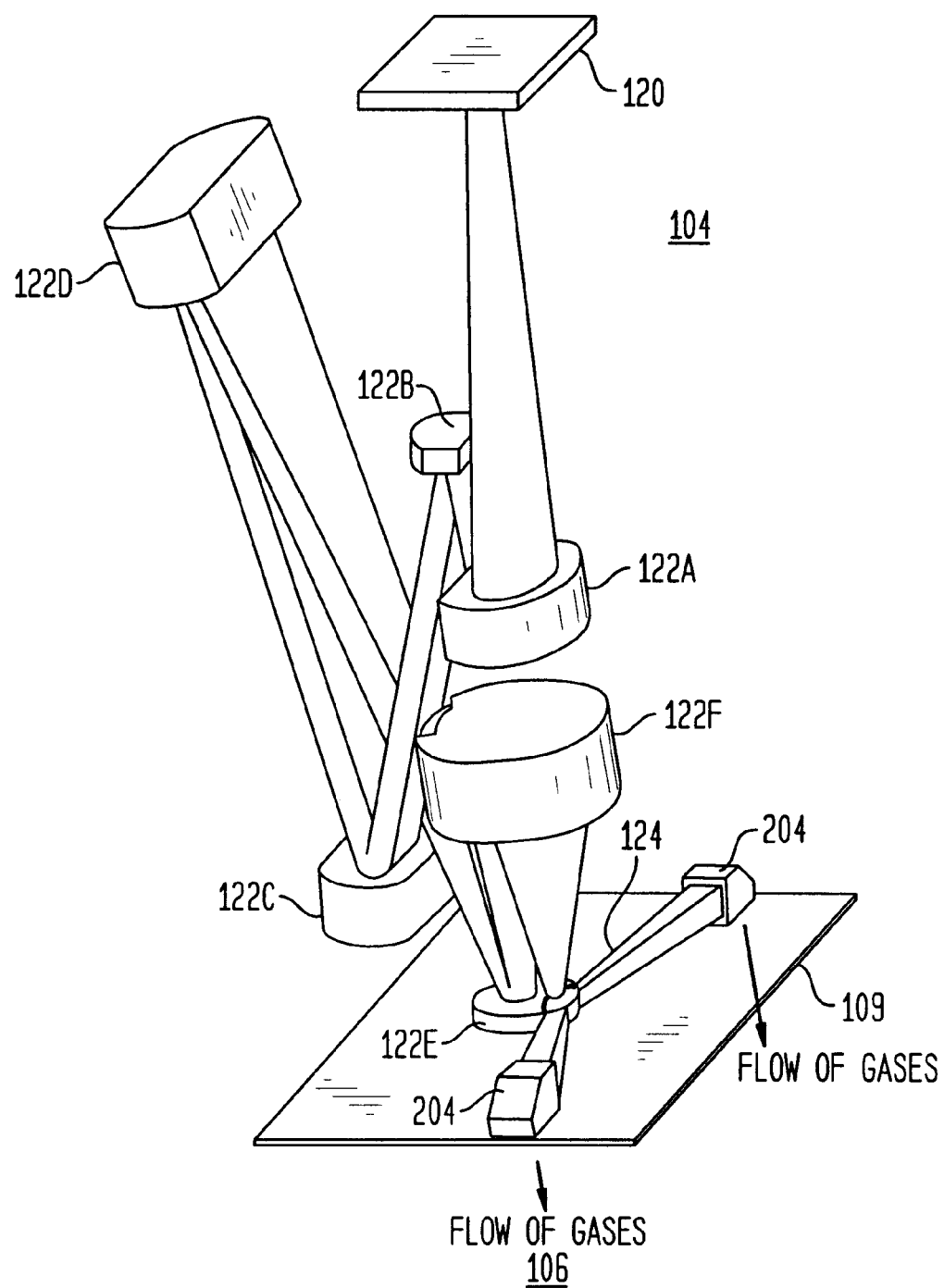
FIG. 2 is a diagram of the projection optics of the system of FIG. 1.

FIG. 2 is a detailed diagram of the projection optics of EUV lithography system 100. FIG. 2 shows the path of travel of EUV light from reticle 120 into outgassing mitigation device 124. Mirrors 122A–F are located in pressure zone 104 of vacuum chamber 102 (not shown). Partition 109 separates pressure zone 104 from pressure zone 106.

As can be seen in FIG. 2, outgassing mitigation device 124 couples to partition 109. For the embodiment shown, outgassing mitigation device 124 preferably has two ducts 204 through which gases from pressure zone 104 can pass to reach pressure zone 106. In other embodiments, however, outgassing mitigation device 124 can have only one duct 204. (One duct would be sufficient to permit the gases to reach pressure zone 106 for the embodiment shown, however, two ducts are used in the embodiment in order to avoid the supporting structure (not shown) for mirror 11 8D.) Because pressure zone 106 is maintained at a lower pressure than pressure zone 104, gases in pressure zone 104 naturally flow from pressure zone 104 through outgassing mitigation device 124 into pressure zone 106. The length of ducts 204 are long enough to discharge the flow of gases away from wafer stage equipment, such as step and scan device 130, located in pressure zone 106. The details of outgassing mitigation device 124 are further illustrated in FIGS. 3–7.

Figure 3:
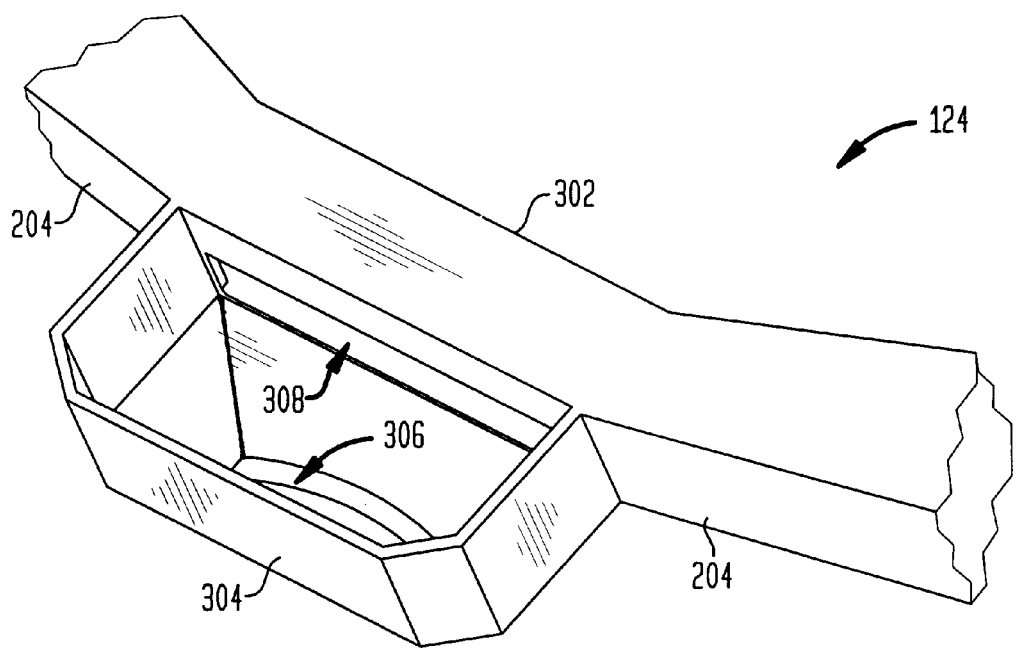
FIG. 3 is a top view of a portion of a photoresist outgassing mitigation device according to the present invention.

As illustrated in FIG. 3, the two ducts 204 of outgassing mitigation device 124 are connected by a section of duct 302 to form a single piece of duct work. A chimney 304 is also connected to the section of duct 302. Chimney 304 has an opening 306 through which EUV light can pass. The shape of opening 306 is preferably matched to the shape of the cross section of the EUV light beam or bundle that passes through chimney 304. The section of duct 302 also has an opening 308 to permit gases in chimney 304 to enter the duct work, thus enabling chimney 304 to serve as an inlet opening for outgassing mitigation device 124.

Figure 4A:
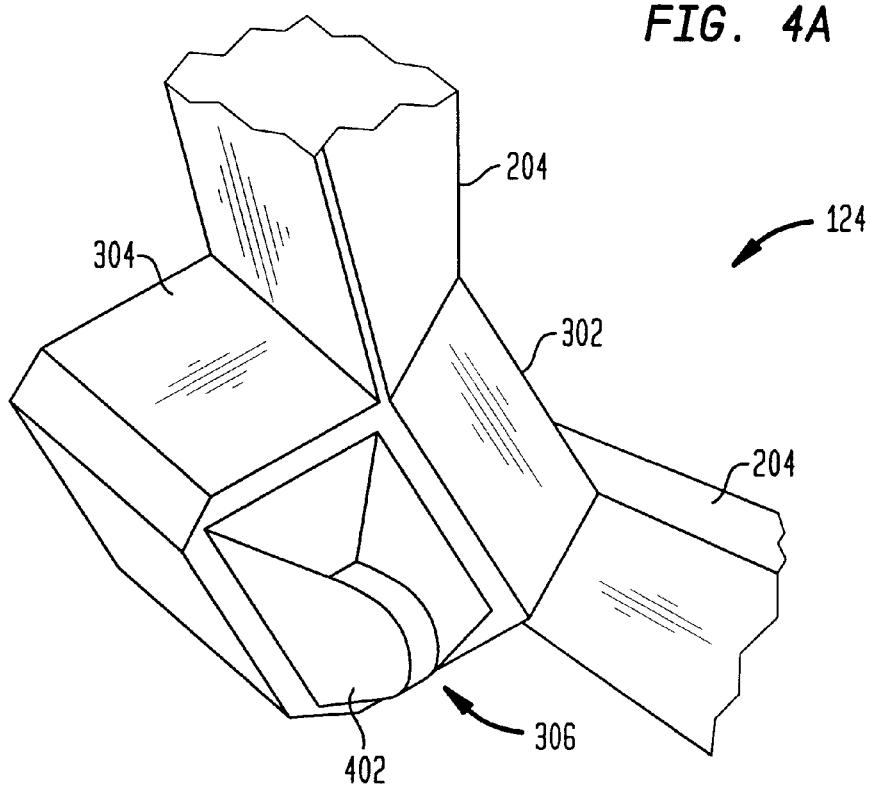
FIG. 4A is a bottom view of a portion of a photoresist outgassing mitigation device according to the present invention.
Figure 4B:
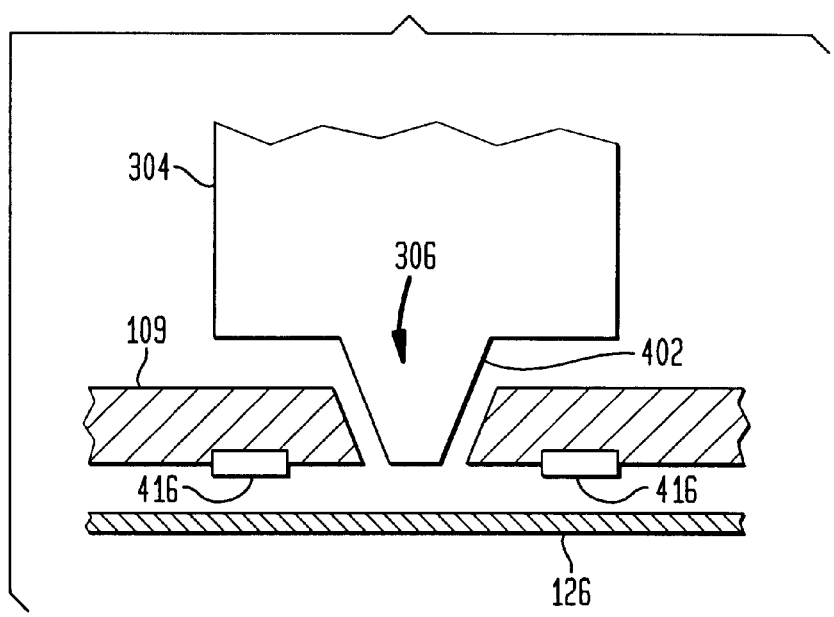
FIG. 4B is a side view of a portion of a photoresist outgassing mitigation device according to the present invention.

FIG. 4A shows the underside of outgassing mitigation device 124. As can be seen in FIG. 4A, chimney 304 has a funnel-shaped section 402. Funnel-shaped section 402 preferably passes through an opening in partition 109, as shown in FIG. 4B, and extends through partition 109 so that opening 306 is in close proximity to wafer 126 while it is being exposed. The size of opening 306 limits the number of resist outgassing molecules that can migrate from pressure zone 106 into pressure zone 104 through chimney 304.

Figure 5:
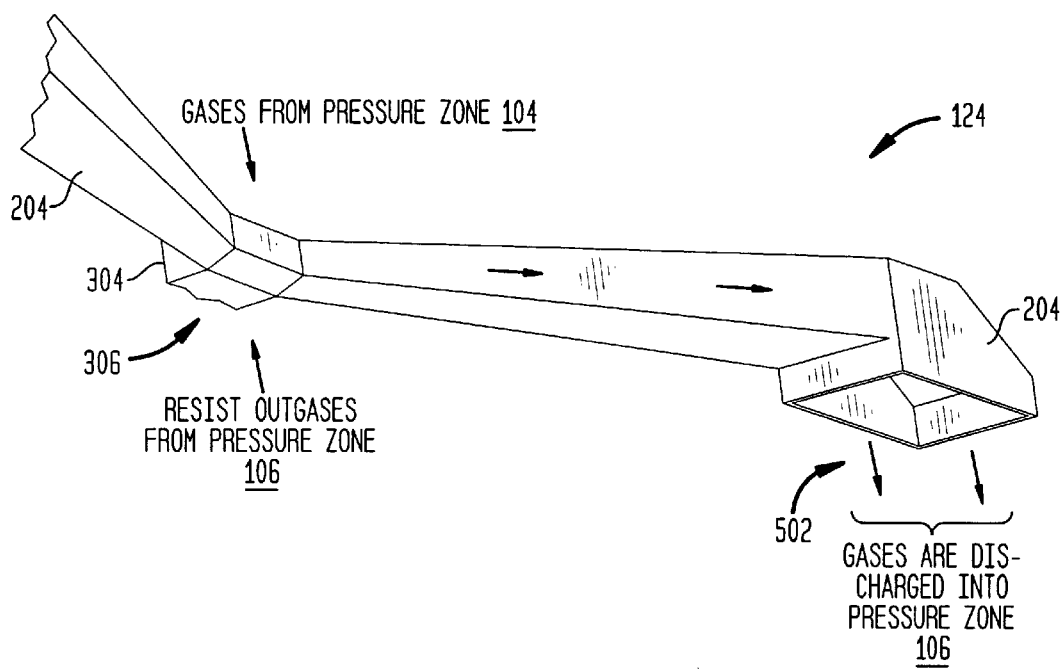
FIG. 5 is a side view of a portion of a photoresist outgassing mitigation device according to the present invention.

FIG. 5 illustrates the flow of gases through outgassing mitigation device 124. As shown in FIG. 5, gases can enter outgassing mitigation device 124 either from pressure zone 104 or pressure zone 106. Gases enter outgassing mitigation device 124 from pressure zone 106 through opening 306.

As described above, pressure zone 104 is maintained at a higher pressure than pressure zone 106. Thus, there is a natural flow of gases from pressure zone 104 through chimney 304 to pressure zone 106. Because opening 306 is small in size and is in close proximity to wafer 126, gas flow from pressure zone 104 through opening 306 to pressure zone 106 is restricted. The flow path of least resistance for gases flowing from pressure zone 104 to pressure zone 106 is through the two ducts 204 of outgassing mitigation device 124. Gases flowing through ducts 204 are discharged into pressure zone 106 through openings 502 at the ends of ducts 204. Openings 502 serve as discharge openings for outgassing mitigation device 124.

Although the flow of gases from pressure zone 104 through opening 306 into pressure zone 106 is restricted, resist outgases produced during the exposure of a wafer do flow through opening 306 into chimney 304 of outgassing mitigation device 124. Depending on the momentum of these outgases, they can either be carried by the stream of gases entering chimney 304 from pressure zone 104 into the ducts 204 of outgassing mitigation device 124, in which case they are discharged into pressure zone 106 as described above, or they can continue through chimney 304 and enter pressure zone 104. To reduce the momentum of the resist gases entering chimney 304 through opening 306, a baffle 602 (see FIG. 6A) is inserted into chimney 304.

Figure 6A:
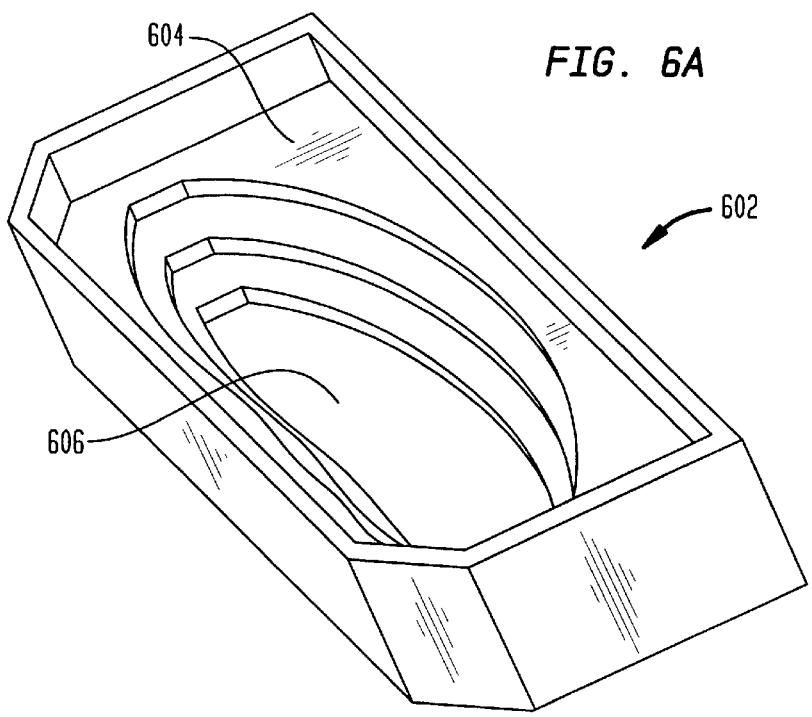
FIG. 6A is a top view of a baffle for a photoresist outgassing mitigation device according to the present invention.

FIG. 6A shows a preferred embodiment of baffle 602. Baffle 602 comprises a plurality of baffle plates 604, which have openings 606 to permit EUV light to pass through the baffle. The size and shape of openings 606 are preferably matched to the cross section of the EUV light beam or bundle used to expose wafer 126. Baffle 602 precludes a significant portion of the hydrocarbon resist gases, which enter chimney 304 through opening 306, from entering pressure zone 104.

Figure 7A:
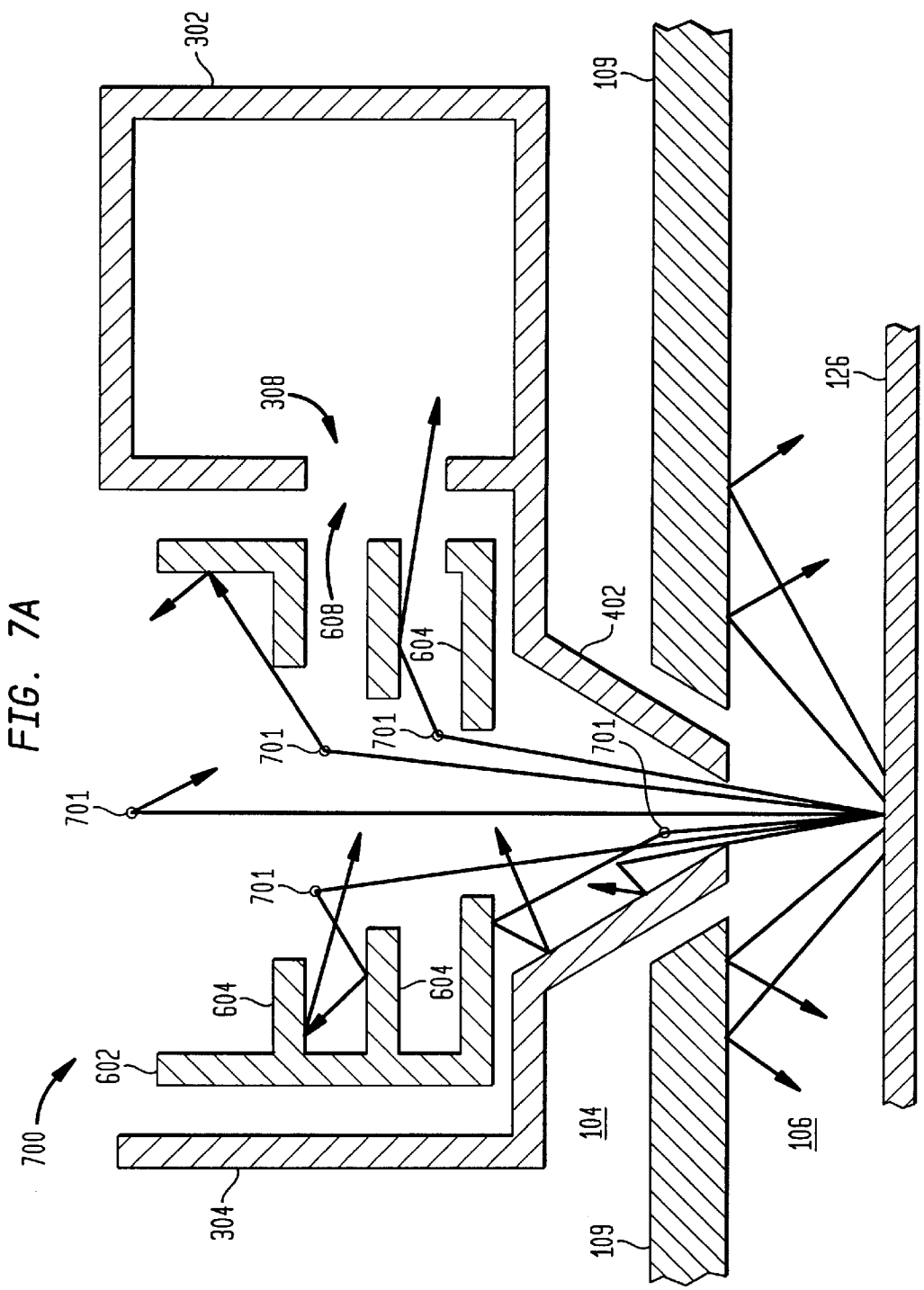
FIG. 7A is a side view of an embodiment of a photoresist outgassing mitigation device according to the present invention.

Outgases generated at the surface of wafer 126 leave the surface of wafer 126 in all directions, as shown in an embodiment 700 of the present invention in FIG. 7A. While some of these outgases leave the wafer's surface at an angle substantially normal to the wafer's surface, many do not. The outgases that leave the surface of wafer 126 at an angle significantly different than normal are prevented from entering pressure zone 104 by partition 109. The outgases that leave the surface of wafer 126 at some angle other than substantially normal, and that enter chimney 304 through opening 306, are intercepted by baffle 602. Even outgases that leave the surface of wafer 126 at an angle normal to the wafer will have difficulty making their way into pressure zone 104 because they will collide with other gas molecules in chimney 304 and exchange their momentum, as shown in FIG. 7A. Collisions 701, in FIG. 7A, are example locations where two gas molecules exchanged their momentum.

Figure 6B:
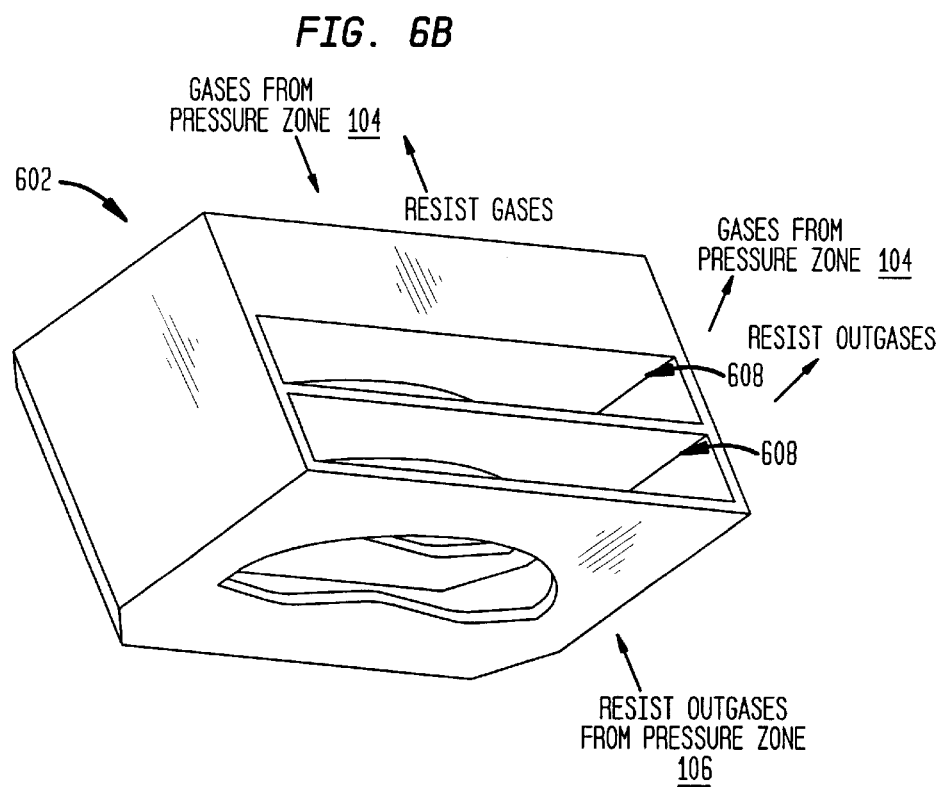
FIG. 6B is a rear view of a baffle for a photoresist outgassing mitigation device according to the present invention.

As illustrated in FIG. 6B, baffle 602 has at least one opening 608 that allows gases to flow from chimney 304 of outgassing mitigation device 124 into the ducts 204 of outgassing mitigation device 124. Openings 608 align with opening 308, which is best seen in FIG. 7A.

Figure 7B:
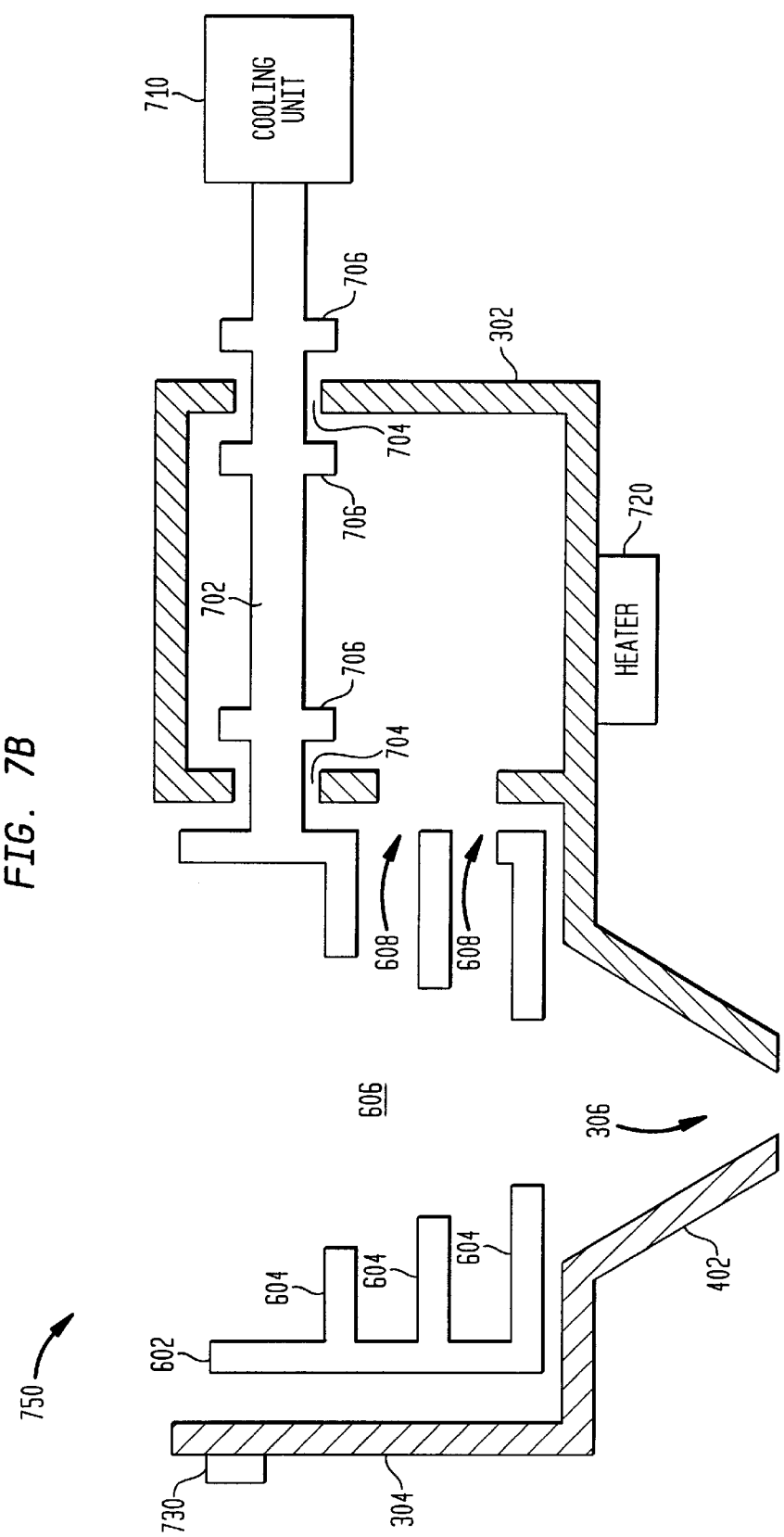
FIG. 7B is a side view of an embodiment of a photoresist outgassing mitigation device according to the present invention.
Figure 7C:
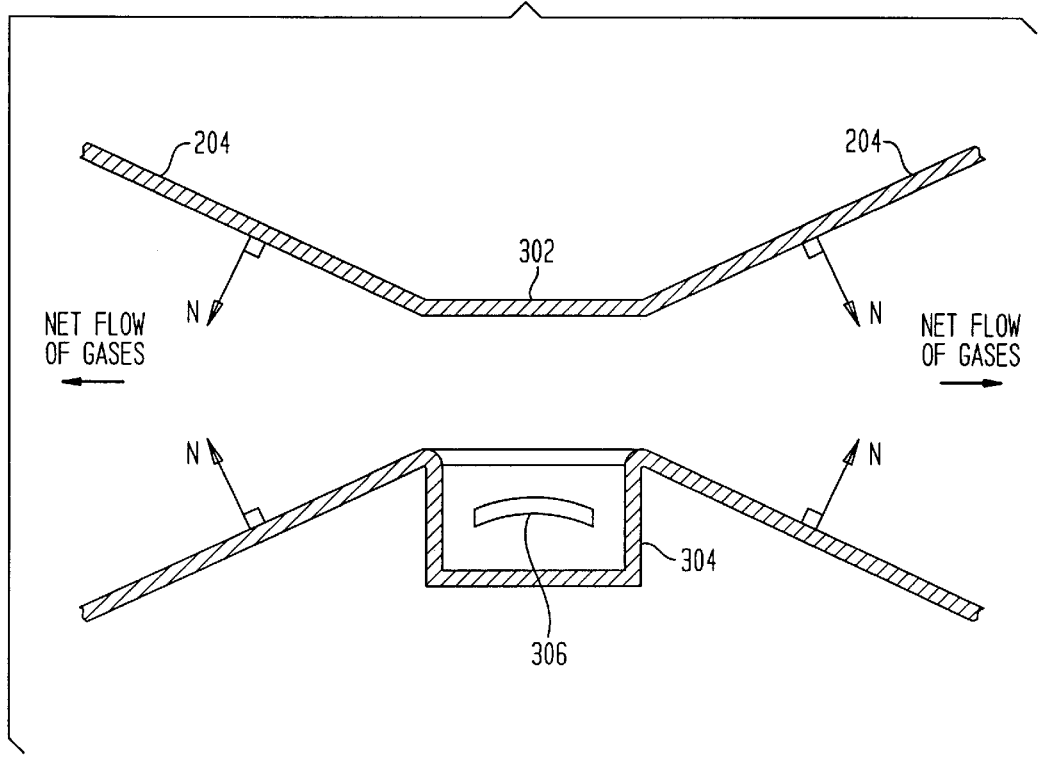
FIG. 7C is a top view of an embodiment of a photoresist outgassing mitigation device according to the present invention.

In an embodiment of the present invention, the diameter of ducts 204 increase from about 10 millimeters near section of duct 302 to about 100 millimeters near openings 502 at the ends of ducts 204, as illustrated in FIG. 7C. The expanding diameter of ducts 204 ensures that the walls of ducts 204 help move the gas molecules towards opening 502 and into pressure zone 106. Because the mean free path of the gases is no longer small compared to the distances between the walls of ducts 204, the flow of the gases within ducts 204 is not viscous. A gas molecule within duct 204 is nearly as likely to collide with a wall of duct 204 as it is to collide with another gas molecule. Thus, wall collisions are a significant factor in the movement of the gases within ducts 204. As would be know to persons skilled in the relevant arts, a molecule making diffuse collisions with a wall is scattered in a direction independent of its original path of travel, and its momentum is statistically the same before and after the collision unless the wall is chilled. A molecule making a diffuse collision with a wall is emitted from the wall at an angle $\theta$ with a probability that is proportional to the cosine of the angle from the normal to the wall. The most probable angle of emission is zero degrees from the normal to the wall. By using ducts that have expanding diameters, the normals to the walls of the a duct always point towards an opening 502 and make it likely that a gas molecule that collides with a wall will be emitted in a direction towards an opening 502. As shown in FIG. 5, openings 502 discharge into pressure zone 106.

In a preferred embodiment of the present invention, baffle 602 is chilled. Chilling baffle 602 reduces the likelihood that an outgas molecule will strike baffle 602 and bounce off. As would be known to persons skilled in the relevant arts, molecules that collide with a chilled surface tend to condense or adsorb to the surface. Chilling baffle 602 ensures that when an outgas molecule strikes baffle 602, a significant portion of the molecule's momentum or energy will transferred to the baffle, and as a result the molecule will be prevented from going further into pressure zone 104. As described above, changed momentum outgas molecules are carried from chimney 304 into the ducts 204 of outgassing mitigation device 124 and discharged into pressure zone 106.

In a preferred embodiment 750 of the present invention, shown in FIG. 7B, heat is removed from baffle 602 using a heat conducting rod or heat pipe 702 and a cooling unit 710. Baffle 602 is preferably supported by heat pipe 702 so that baffle 602 is thermally isolated from chimney 304 without the need for insulating spacers. Alternatively, baffle 602 can be thermally insulated from chimney 304 using, for example, rubber spacers. Heat pipe 702 passes through holes 704 in section of duct 302 and is coupled to baffle 602. Concentric circular flanges 706 form a labyrinth seal that limits the number of gas molecules that migrate from section of duct 302 through holes 704 into pressure zone 104. Other methods for chilling baffle 602 will be apparent to a person skilled in the relevant art given the discussion herein.

As shown in FIG. 7B, embodiment 750 of the present invention also comprises a heater 720 and a temperature sensor 730 that regulate the temperature of outgassing mitigation device 124 (but not baffle 602). In the embodiment 750, heater 720 is coupled to section of duct 302 of outgassing mitigation device 124. Temperature sensor 730 is coupled to chimney 304 of outgassing mitigation device 124. Temperature sensor 730 monitors the temperature of outgassing mitigation device 124, and provides an input to a control module (not shown). Heater 720 is turned-on and turned-off as needed by the control module in order to maintain the temperature of outgassing mitigation device 124 at a predetermined value.

Figure 8:
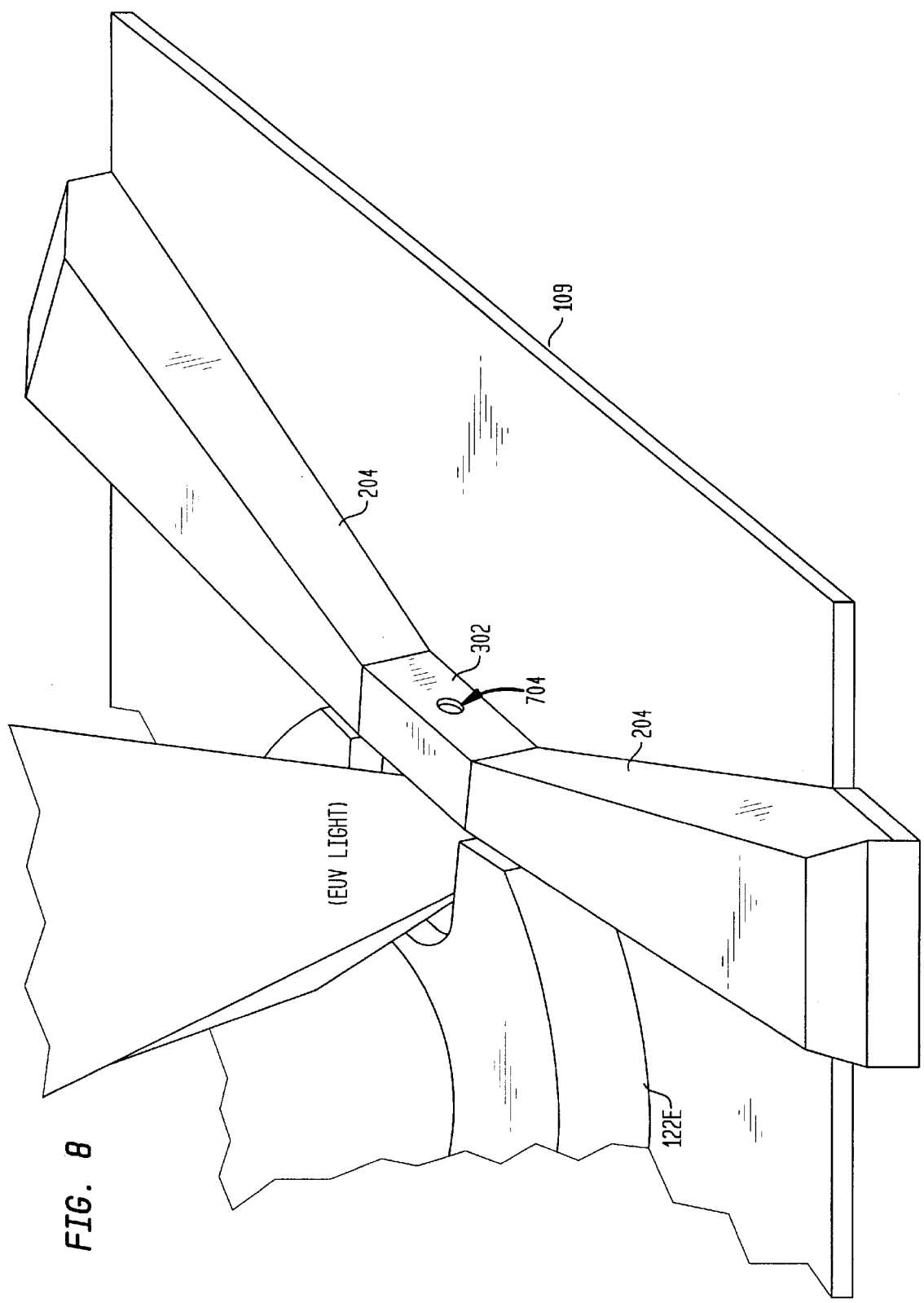
FIG. 8 is a detailed diagram of a portion of the system of FIG. 1.

Maintaining the temperature of outgassing mitigation device 124 at a predetermined value is an important feature of the present invention in some embodiments. For example, in some embodiments of the present invention, it may be necessary to locate outgassing mitigation device 124 in close proximity to a mirror. In such embodiments, outgassing mitigation device 124 (but not baffle 602) is preferably maintained at a temperature substantially equal to the temperature at which the mirror in close proximity was manufactured and tested. For example, FIG. 8 illustrates an embodiment wherein chimney 304 is located in a cutout portion of mirror 122E. In this embodiment, if mirror 122E was manufactured and tested at 20° C., then outgassing mitigation device 124 should be maintained at about 20° C. By maintaining the temperature of outgassing mitigation device 124 at about 20° C., chimney 304 acts as a thermal shield between mirror 122E and chilled baffle 602, thereby preventing any temperature induced distortion of mirror 122E, caused by chilled baffle 602, that might adversely affect the performance of the projection optics. Also shown in FIG. 8 is hole 704 through which heat pipe 702 passes. Embodiments of the present invention that do not have a chilled baffle 602 do not have a hole 704.

Preferred Embodiment of a Photoresist Outgassing Mitigation System

Outgassing mitigation device 124 prevents a significant number of outgas molecules from entering pressure zone 104 and potentially contaminating the projection optics of EUW lithography system 100. It does not, however, preclude every outgas molecule from entering pressure zone 104. As described above, some outgas molecules that leave wafer 126 at an angle substantially normal to the surface of wafer 126 can travel through opening 306, and the openings 606 of baffle 602, and enter pressure zone 104. In the preferred embodiment of the present invention, therefore, two additional elements are included to prevent these molecules from entering pressure zone 104. These elements are illustrated in FIG. 9.

Figure 9:
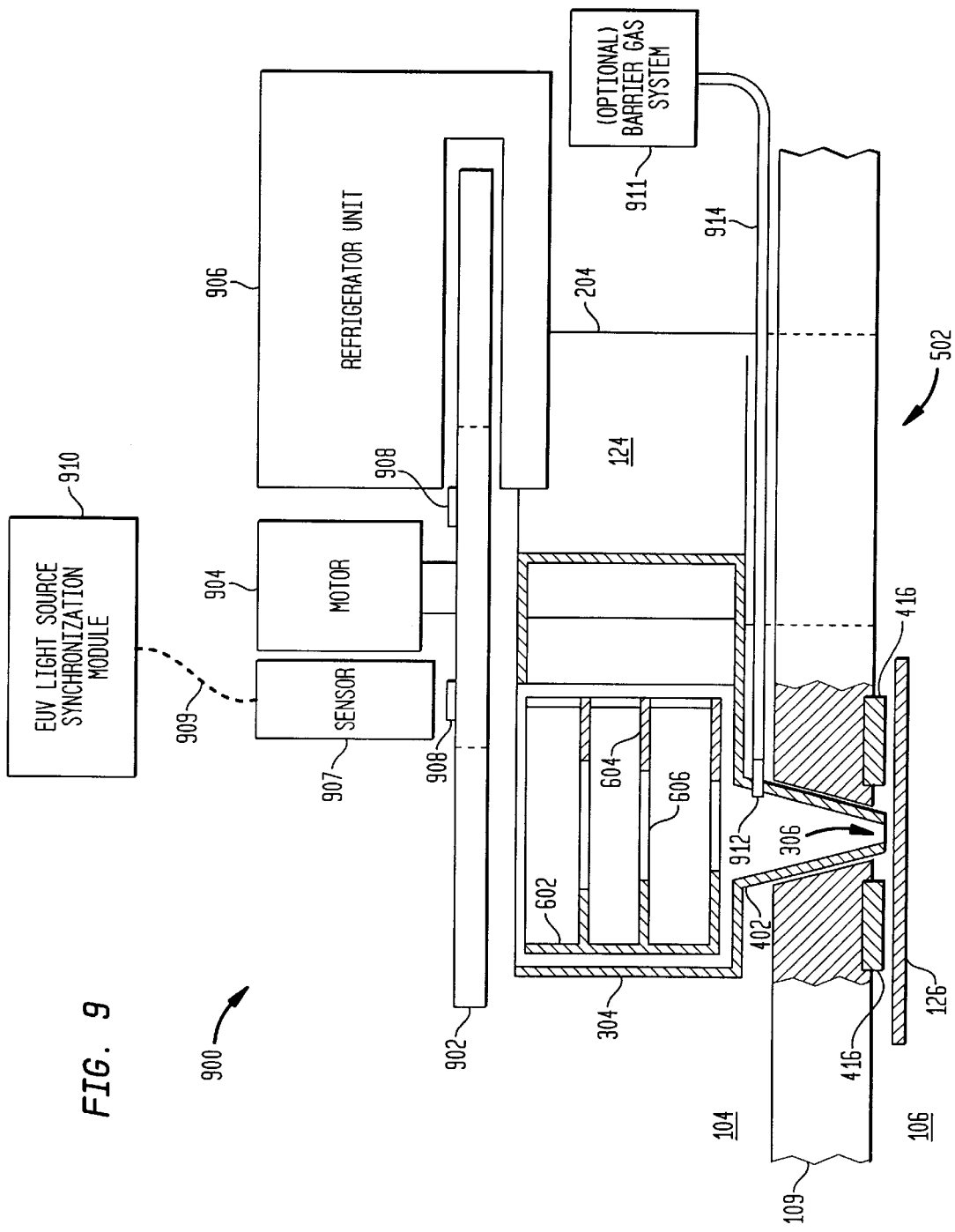
FIG. 9 is a diagram of a photoresist outgassing mitigation system according to the present invention.

FIG. 9 shows an outgassing mitigation system 900 according to the present invention. In addition to outgassing mitigation device 124, described above, outgassing mitigation system 900 comprises a mechanical barrier 902 and an optional barrier gas system 911.

Barrier 902 is configured to cover and substantially close chimney 304. As used herein, substantially close means that barrier 902 is located within a few millimeters of chimney 304 in order to block outgas molecules exiting chimney 304 towards pressure zone 104. In a preferred embodiment of the present invention, barrier 902 is located at a distance of about one millimeter from chimney 304. Outgas molecules in chimney 304, for example hydrocarbon molecules, that are traveling out of chimney 304 toward pressure zone 104 are stopped from going further into pressure zone 104 because they strike barrier 902, which is located in the molecule's path of travel.

In a preferred embodiment of the present invention, barrier 902 is a rotating disk that is radiantly chilled by a refrigerator unit 906. The rotating disk is supported by magnetic bearings (not shown) that preclude heat transfer between the disk and the motor's stator (not shown). When an outgas molecule passes through baffle 602 and strikes barrier 902, its momentum is reduced. Because barrier 902 is chilled, outgas molecules that strike barrier 902 tend to condense on barrier 902. Molecules that condense on barrier 902 are precluded from going further into pressure zone 104 and condensing on the projection optics of EUV lithography system 100.

Figure 10:
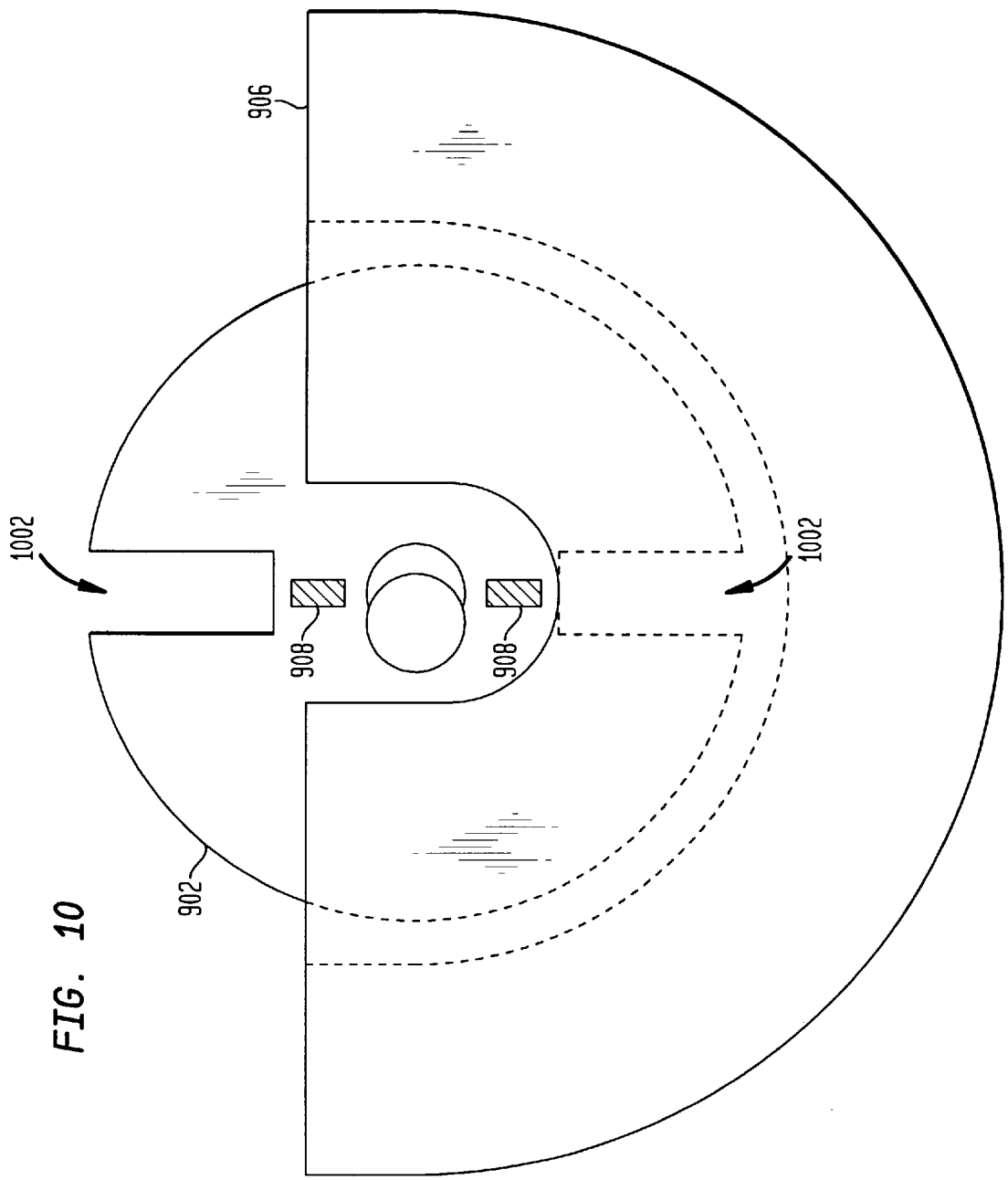
FIG. 10 is a diagram of a rotating barrier of a photoresist outgassing mitigation system according to the present invention.

As illustrated in FIG. 10, barrier 902 has at least one aperture 1002 that permits EUV light to pass through barrier 902 as it rotates, and thus expose wafer 126. As shown in FIG. 9, a motor 904 is used to rotate barrier 902 so that apertures 1002 periodically pass over chimney 304. Motor 904 is preferably a motor having oil-free magnetic bearings in order to reduce the potential for contaminating the projection optics, and to make it easy to keep the disk very cold because no heat is conducted across the magnetic bearing. As apertures 1002 pass over chimney 304, a sensor 907 senses an aperture position indicator 908 and sends a (e.g., electromagnetic) signal via a communications link 909 to an EUV light source synchronization module 910. Position indicator 908 can be anything that will be sensed by sensor 907. For example, position indicator 908 can be a metal pickup device, a reflective tape, or a hole that permits the passage of electromagnetic radiation which is detected by sensor 907. Other position indication means, such as mechanical apparatus, that can be used will be apparent to a person skilled in the relevant arts given the discussion herein.

In the preferred embodiment of the present invention, whenever EUV light source synchronization module 910 receives a signal from sensor 907, it triggers EUV light source 114. Because EUV light source 114 is triggered only when an aperture 1002 is over chimney 304, barrier 902 does not act as a barrier to the EUV light.

Whenever wafer 126 is exposed to the EUV light, outgases are produced. Before the hydrocarbon outgas molecules that are produced by the EUV light exposure can enter opening 306 of outgassing mitigation device 124 and pass through baffle 602, barrier 902 is rotated so that aperture 1002 has moved beyond the opening of chimney 304. In this manner, any hydrocarbon outgas molecules that are able to pass through baffle 602 are stopped by barrier 902 and precluded from going further into pressure zone 104, where they might possibly contaminate the projection optics of EUV lithography system 100.

Another element of outgassing mitigation system 900 that prevents hydrocarbon outgas molecules from reaching pressure zone 104 is optional barrier gas system 911. Barrier gas system 911 injects a heavy gas, for example argon, into the funnel section 402 of chimney 304. The heavy gas then acts as a barrier to the hydrocarbon outgas molecules that enter chimney 304 through opening 306. As the hydrocarbon outgas molecules collide with the heavy barrier gas molecules, the outgas molecules exchange their momentum with the heavy barrier gas molecules. This randomizes their direction of travel but does not slow them down. (In a gas, kinetic energy and temperature are equivalent. Thus, the only way to slow down the average molecule is to cool the gas. This cannot be done by random collisions with another gas.) The randomized outgas molecules are then carried away from chimney 304 by the natural flow of the gases passing from chimney 304 through the ducts 204 of outgassing mitigation device 124 into pressure zone 106.

As can be seen in FIG. 9, the shape of funnel section 402 of outgassing mitigation device 124 permits one or more capacitive focusing devices 916 to be mounted close to the exposure area of wafer 126. The proximity of wafer 126 to opening 306 of outgassing mitigation device 124 restricts the flow of gases trying to exit chimney 304 through opening 306, thereby ensuring that gases flow through ducts 204 to reach pressure zone 106. The lengths of ducts 204 are such that the discharge openings 502 of ducts 204 are never blocked by wafer stage equipment, e.g., chuck 128 or step and scan device 130.

Figure 11:
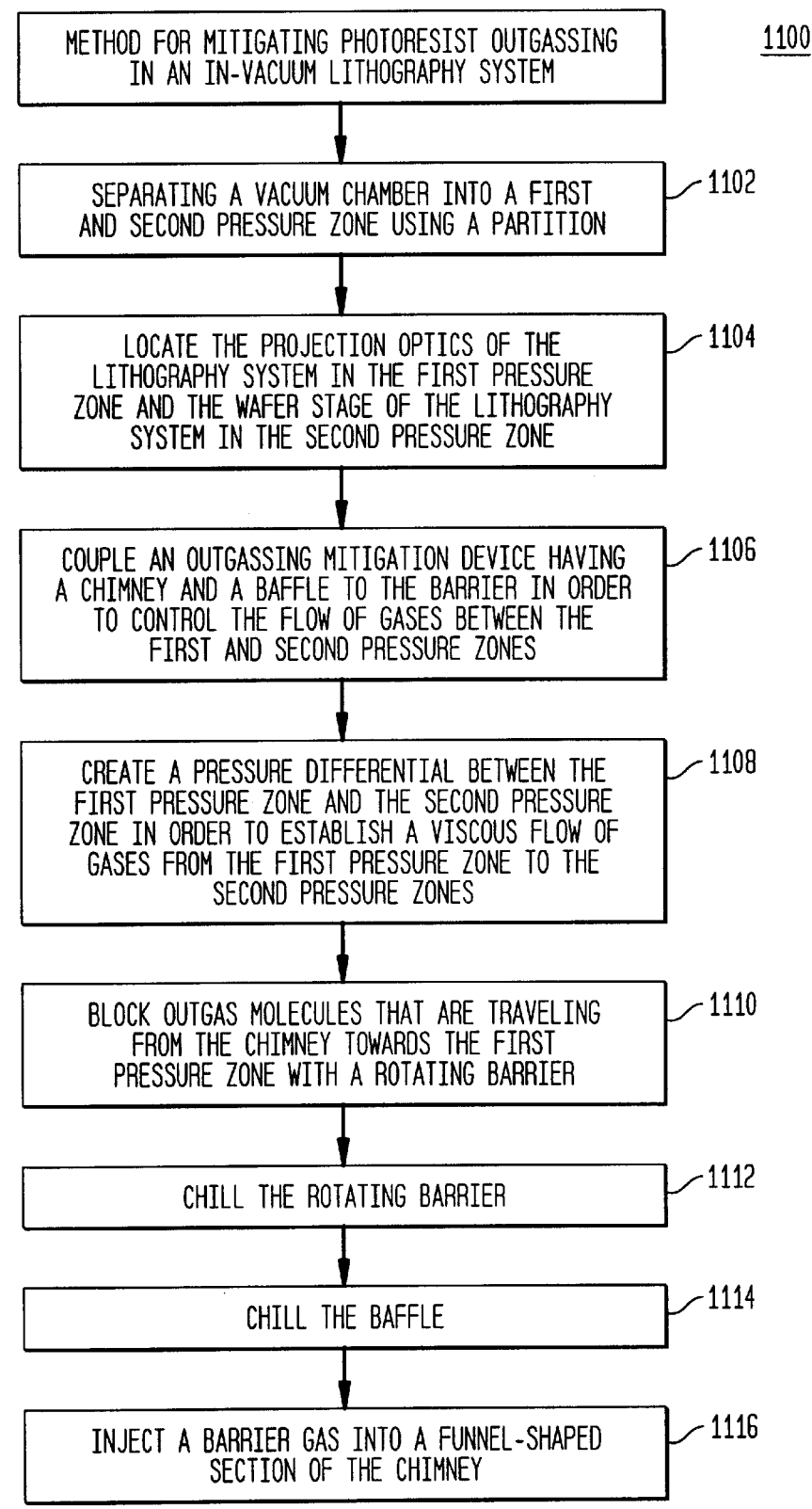
FIG. 11 is a flowchart illustrating a method for mitigating photoresist outgassing according to the present invention

Preferred Method for Mitigating Photoresist Outgassing in an In-Vacuum Photolithography System FIG. 11 is a flowchart that illustrates a preferred method 1100 for mitigating photoresist outgassing in an in-vacuum lithography system, according to the present invention. Method 1100 can be implemented using the outgassing mitigation device and system embodiments described above. In order to more clearly describe method 1100, method 1100 will be described using example EUV lithography system 100. As would be apparent to a person skilled in the relevant art, however, method 1100 can be implemented in other lithography systems in addition to example EUV lithography system 100.

Method 1100 starts with step 1102. In step 1102, vacuum chamber 102 of lithography system 100 is separated into two pressure zones 104 and 106 using a partition 109. Pressure zones 104 and 106 are both capable of being evacuated in order to establish a vacuum.

In step 1104, the projection optics of lithography system 100 are located within pressure zone 104 and the wafer stage of lithography system 100 is located in pressure zone 106. The projection optics are placed in a separate pressure zone from the wafer stage in order to limit the number of photoresist outgases that can come into contact with the projection optics.

In step 1106, an outgassing mitigation device 124 is coupled to partition 109. Outgassing mitigation device 124 has a chimney 304 and a baffle 602. The purpose of outgassing mitigation device 124 is to control the flow of gases between pressure zones 104 and 106 while letting actinic light through. How outgassing mitigation device 124 controls the flow of gases is described above.

In step 1108, a pressure differential is created between pressure zone 104 and 106 in order to establish a viscous flow of gases between pressure zones 104 and 106. To create the pressure differential, pressure zones 104 and 106 are evacuated, but the pressure in pressure zone 106 is evacuated to a pressure lower than the pressure of pressure zone 104. Pressure zone 104 is maintained at a pressure sufficient to maintain a viscous flow of the gases in pressure zone 104 between mirror 122F and wafer 126. In an embodiment of the present invention, a pressure of about 24 mTorr is maintained in pressure zone 104 during the lithography process in order to ensure viscous flow of the gases. A pressure of about 10 mTorr is maintained in pressure zone 106.

In step 1110, a rotating barrier is used to block outgas molecules traveling from chimney 304 towards pressure zone 104. Whenever a wafer 126 is exposed to the EUV light, outgases are produced. Before the outgas molecules, for example hydrocarbon outgas molecules, that are produced by the EUV light exposure can enter an opening 306 of outgassing mitigation device 124 and pass through baffle 602, barrier 902 is rotated so that an aperture 1002 has moved beyond the opening of chimney 304. In this manner, any hydrocarbon outgas molecules that are able to pass through baffle 602 are stopped by barrier 902 and precluded from entering pressure zone 104, where they might possibly contaminate the projection optics of lithography system 100.

In an optional step 1112 of method 1100, barrier 902 is radiantly chilled by a refrigerator unit 906. When an outgas molecule passes through baffle 602 and strikes barrier 902, its momentum is reduced. Because barrier 902 is chilled, outgas molecules that strikes barrier 902 tend to condense on barrier 902. Molecules that condense on barrier 902 are precluded from going further into pressure zone 104 and condensing on the projection optics of EUV lithography system 100.

In an optional step 1114 of method 1100, baffle 602 is chilled. Chilling baffle 602 reduces the likelihood that an outgas molecule will strike baffle 602 and bounce off without transferring a significant amount of its momentum to baffle 602.

In an optional step 1114 of method I100, a barrier gas is injected into a funnel-shaped section of chimney 304. In this step, a barrier gas system 911 injects a heavy gas, for example argon, into a funnel section 402 of chimney 304. The heavy gas then acts as a barrier to outgas molecules that enter chimney 304 through opening 306. As the outgas molecules collide with the heavy barrier gas molecules, the outgas molecules exchange their momentum with the heavy barrier gas molecules. This randomizes the direction of travel of the outgas molecules and enables them to be carried away from chimney 304 by the natural flow of the gases passing from chimney 304 through ducts 204 of outgassing mitigation device 124 into pressure zone 106.

How to implement each of the steps of method 1100 is further explained above with regard to FIGS. 1–10. As would be apparent to a person skilled in the relevant art given the discussion herein, embodiments of the present invention other than those used to describe how to implement steps 1102–1116 can also be used to implement method 1100, without departing from the spirit and scope of the present invention.

Conclusion

Various embodiments of the present invention have been described above, which can be used to mitigate outgassing in an EUV in-vacuum lithography system. It should be understood that these embodiments have been presented by way of example only, and not limitation. It will be understood by those skilled in the relevant arts that various changes in form and details of the embodiments described above may be made without departing from the spirit and scope of the present invention as defined in the claims. Thus, the breadth and scope of the present invention should not be limited by any of the above-described exemplary embodiments, but should be defined only in accordance with the following claims and their equivalents.

What is claimed is:

1. A photoresist outgassing mitigation apparatus for use in a lithography system, comprising:
a chimney;
a duct fluidly coupled to said chimney; and
a baffle disposed within said chimney,
said outgassing mitigation apparatus being coupled to a partition of said lithography system that separates a first pressure zone of said lithography system from a second pressure zone of said lithography system, when in use, so that gases flowing through said duct from said first pressure zone are discharged into said second pressure zone.

2. The apparatus of claim 1, wherein said duct comprises:
an inlet opening; and
at least one discharge opening.

3. The apparatus of claim 1, wherein said baffle comprises:
a plurality of baffle plates having cutouts for the passage of light.

4. The apparatus of claim 1, wherein said chimney has an opening at a first end for the passage of a bundle of light having a cross section and wherein the shape of said opening substantially conforms to the shape of the cross section.

5. The apparatus of claim 4, further comprising:
a rotating barrier having at least one aperture for the passage of the bundle of light, said rotating barrier being positioned near said chimney so that said rotating barrier substantially closes a second end of said chimneys except when one of said apertures of said rotating barrier passes by said second end of said chimney, thereby blocking outgas molecules exiting said chimney towards said first pressure zone.

6. The apparatus of claim 5, further comprising:
a refrigerator unit radiantly coupled to said rotating barrier.

7. The apparatus of claim 6, further comprising:
a motor coupled to said rotating barrier.

8. The apparatus of claim 7, wherein said motor has magnetic bearing.

9. The apparatus of claim 7, further comprising:
a light source synchronisation module that synchronizes the triggering of a pulsed light source with the passage of said apertures of said rotating barrier by said second end of said chimney.

10. The apparatus of claim 9, further comprising:
a sensor module for determining the position of said apertures relative to said second end of said chimney.

11. The apparatus of claim 4, wherein said baffle is thermally insulated from said chimney.

12. The apparatus of claim 11, wherein said baffle is chilled.

13. The apparatus of claim 12, wherein said duct is heated so that it is maintained at a temperature higher than the temperature of said baffle and said rotating barrier.

14. The apparatus of claim 4, further comprising:

a barrier gas system coupled to said chimney, said barrier gas system for injecting a barrier gas into said chimney.

15. The apparatus of claim 14, wherein said barrier gas comprises argon.

16. A photoresist outgassing mitigation system for use in a lithography system, comprising:

an outgassing mitigation device having a chimney;

a baffle disposed withing said chimney;

a rotating barrier having at least one aperture for the passage of light, said rotating barrier being position near said chimney so that said rotating barrier substantially closes an end of said chimney except when one of said apertures of said rotating barrier passes by said end of said chimney; and a refrigerator unit that radiantly couples to said rotating barrier to chill said rotating barrier, said outgassing mitigation device being coupled to a partition of said lithography system that separates a first pressure zone of said lithography system from a second pressure zone of said lithography system, when in use, so that gases flowing through said duct from said first pressure zone are discharged into said second pressure zone.

17. The system of claim 16, further comprising:

a sensor that determines when one of said apertures of said rotating barrier passes by said end of said chimney; and a light source synchronisation module that receives a signal from said sensor and triggers a pulsed light source.

18. The system of claim 17, further comprising:

a motor coupled to said rotating barrier.

19. The system of claim 18, further comprising:

a barrier gas system coupled to said chimney, said barrier gas system for injecting a barrier gas into said chimney.

20. The system of claim 19, wherein said barrier gas comprises argon.

21. A method for mitigating photoresist outgassing in an in-vacuum lithography system, comprising the steps of:

(1) separating a vacuum chamber into a first and second pressure zone using a partition;

(2) locating the projection optics of the lithography system in the first pressure zone and the wafer stage of the lithography system in the second pressure zone;

(3) creating a pressure differential between the first pressure zone and the second pressure zone;

(4) coupling an outgassing mitigation device having a chimney, a duct, and a baffle to the partition; and (5) establishing a flow of gases from the first pressure zone to the second pressure zone through the duct of the outgassing mitigation device so that gases in the duct are discharged into the second pressure zone.

22. The method of claim 21, further comprising the step of:

(6) blocking outgas molecules that are traveling from the chimney towards the first pressure zone with a rotating barrier.

23. The method of claim 22, further comprising the step of:

(7) chilling the rotating barrier.

24. The method of claim 23, further comprising the step of:

(8) chilling the baffle.

25. The method of claim 24, further comprising the step of:

(9) injecting a barrier gas into a funnel-shaped section of the chimney.

* * * * *

UNITED STATES PATENT AND TRADEMARK OFFICE
CERTIFICATE OF CORRECTION

PATENT NO. : 6,369,874 B1
DATED : April 9, 2002
INVENTOR(S) : del Puerto

It is certified that error appears in the above-identified patent and that said Letters Patent is hereby corrected as shown below:

<u>Title page, Item [54] and Column 1, line 2,</u>
Please replace "SYSTEM METHOD AND" with -- SYSTEM, METHOD, AND --.

<u>Column 12,</u>
Lines 5-6, please replace "chimneys" with -- chimney, --.

<u>Column 13,</u>
Line 4, please replace "withing" with -- within --.
Line 6, please replace "position" with -- positioned --.

Signed and Sealed this

Twentieth Day of August, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.     : 6,369,874 B1
DATED          : April 9, 2002
INVENTOR(S)    : del Puerto It is certified that error appears in the above-identified patent and that said Letters Patent is hereby corrected as shown below:

<u>Title page, Item [54] and Column 1, line 2,</u>
Please replace "SYSTEM METHOD AND" with -- SYSTEM, METHOD, AND --.

<u>Column 12,</u>
Lines 43-44, please replace "chimneys" with -- chimney, --.

<u>Column 13,</u>
Line 12, please replace "withing" with -- within --.
Line 15, please replace "position" with -- positioned --.

Signed and Sealed this

Twenty-eighth Day of January, 2003

JAMES E. ROGAN
*Director of the United States Patent and Trademark Office*